United States Patent
Patil et al.

(10) Patent No.: US 9,564,447 B1
(45) Date of Patent: Feb. 7, 2017

(54) METHODS FOR FABRICATING PROGRAMMABLE DEVICES AND RELATED STRUCTURES

(71) Applicant: GLOBALFOUNDRIES Inc., Grand Cayman (KY)

(72) Inventors: Suraj K. Patil, Ballston Lake, NY (US); Ajey P. Jacob, Watervliet, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/842,345

(22) Filed: Sep. 1, 2015

(51) Int. Cl.
*H01L 27/112* (2006.01)
*G11C 13/00* (2006.01)

(52) U.S. Cl.
CPC ..... *H01L 27/11206* (2013.01); *G11C 13/0002* (2013.01); *G11C 13/0009* (2013.01); *H01L 27/112* (2013.01)

(58) Field of Classification Search
CPC ............ G11C 13/0002; G11C 13/0009; H01L 27/112; H01L 27/11206
See application file for complete search history.

(56) References Cited

U.S. PATENT DOCUMENTS

| | | | | |
|---|---|---|---|---|
| 7,135,773 | B2 * | 11/2006 | Furukawa | B82Y 10/00 257/758 |
| 7,473,633 | B2 * | 1/2009 | Furukawa | B82Y 10/00 257/E21.171 |
| 7,989,349 | B2 * | 8/2011 | Sandhu | B82Y 10/00 257/E51.04 |
| 8,008,745 | B2 * | 8/2011 | Bertin | B82Y 10/00 257/209 |
| 8,102,018 | B2 * | 1/2012 | Bertin | B82Y 10/00 257/209 |
| 8,188,569 | B2 * | 5/2012 | Seidl | G11C 11/5678 257/350 |

(Continued)

OTHER PUBLICATIONS

"Electrically Programmable Fuse (eFUSE) Using Electromigration in Silicides", IEEE EDL, vol. 23 No. 9, pp. 523-525, 2002, C. Kothandaraman, et al.

(Continued)

*Primary Examiner* — Evan Pert
(74) *Attorney, Agent, or Firm* — Heslin Rothenberg Farley and Mesiti PC; Nicholas Mesiti

(57) ABSTRACT

Methods and structures for programmable device fabrication are provided. The methods for fabricating a programmable device include, for example forming at least one via opening in a layer of the programmable device and providing a catalyzing material over a lower surface of the at least one via opening; forming a plurality of nanowires or nanotubes in the at least one via opening using the catalyzing material as a catalyst for the forming of the plurality of nanowires or nanotubes; and providing a dielectric material in the at least one via opening so that the dielectric material surrounds the plurality of nanowires or nanotubes. The programmable device may, in subsequent or separate programming steps, have programming of the programmable device made permanent via thermal oxidation of the dielectric material and the plurality of nanowires or nanotubes, leaving a nonconducting material behind in the at least one via opening.

18 Claims, 5 Drawing Sheets

(56) References Cited

U.S. PATENT DOCUMENTS

| | | | | |
|---|---|---|---|---|
| 8,617,869 | B2* | 12/2013 | Culver | B82Y 5/00 |
| | | | | 429/209 |
| 8,816,327 | B2 | 8/2014 | Chang et al. | |
| 9,231,201 | B2* | 1/2016 | Van Schaijk | B82Y 10/00 |
| 2004/0169281 | A1* | 9/2004 | Nguyen | B82Y 10/00 |
| | | | | 257/758 |
| 2007/0096326 | A1* | 5/2007 | Chang | H01L 21/76849 |
| | | | | 257/764 |
| 2010/0108972 | A1* | 5/2010 | Zhao | B82Y 10/00 |
| | | | | 257/2 |

OTHER PUBLICATIONS

"eFuse Design and Reliability", IEEE International Integrated Reliability Workshop, 2008, W.R. Tonti.

"A Novel Via-fuse Technology Featuring Highly Stable Blow Operation with Large On-off Ratio for 32nm Node and Beyond", IEEE IEDM, p. 43, 2007, H. Takaoka, et al.

"Novel approach to fabricating carbon nanotube via interconnects using size-controlled catalyst nanoparticles", IEEE IIT, pp. 230-232, 2006, S. Sato, et al.

"Carbon Nanotube and Graphene Device Physics", Cambridge University Press, p. 173, 2011, H.S. Phillip Wong.

"Rapid thermal oxidation of silicon nanowires", Applied Physics Letters 94, 063113, 2009, S. Krylyuk, et al.

\* cited by examiner

METHODS FOR FABRICATING PROGRAMMABLE DEVICES AND RELATED STRUCTURES

FIELD OF THE INVENTION

The present invention generally relates to fabricating a programmable device, and more specifically to methods of forming a one-time programmable (OTP) device that include forming a plurality of nanowires or nanotubes in a via opening using a catalyzing material.

BACKGROUND

Many integrated circuit structures may include structures or devices, often referred to as electrically programmable fuses or "e-fuses," that enable permanent programming of some portion of the integrated circuit structure. Electrically programmable fuses may be programmed by "blow-out" of the fuse to make that portion of the circuit structure electrically "open," such that once e-fuse programming is completed electric current may no longer flow through the e-fuse, and the programming of the e-fuse is one-time and non-reversible or permanent. In earlier nodes of technology (e.g. 90 nm or greater), the e-fuse is frequently made by poly-Si or silicided poly-Si fabricated at same time as poly-Si gates or silicided gates. As CMOS technology continues to shrink, new transistor feature designs such as FinFETs based on gate-last flow (or replacement gate flow) have been integrated into circuit structure so that the poly-Si gate serves as "dummy" gate and is no longer available. Currently, e-fuses in advanced CMOS and FinFET are based on metal e-fuse fabricated at middle-of-line (MOL) or back-end-of-line (BEOL); the metal e-fuse not only has large foot-print, but also needs a large current applied to thermally "blow" the fuse to open. Such an e-fuse is not suitable for on-chip programming on field (after chip packaged and tested) by using battery power.

SUMMARY OF THE INVENTION

Various shortcomings of the prior art are overcome, and additional advantages are provided through the provision, in one aspect, of a method for fabricating a programmable device, the fabricating including: forming at least one via opening in a programmable device layer of a circuit structure; providing a catalyzing material over a lower surface of the at least one via opening; forming a plurality of nanowires or nanotubes in the at least one via opening using the catalyzing material as a catalyst for the forming of the plurality of nanowires or nanotubes; and providing a dielectric material in the at least one via opening, the dielectric material surrounding, at least in part, the plurality of nanowires or nanotubes.

In another aspect, also provided is a structure including a programmable device, the programmable device including: at least one via opening in a programmable device layer of a circuit structure; a plurality of nanowires or nanotubes in the at least one via, the plurality of nanowires or nanotubes contacting a lower surface of the at least one via opening; and a dielectric material in the at least one via opening, the dielectric material surrounding, at least in part, the plurality of nanowires or nanotubes.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
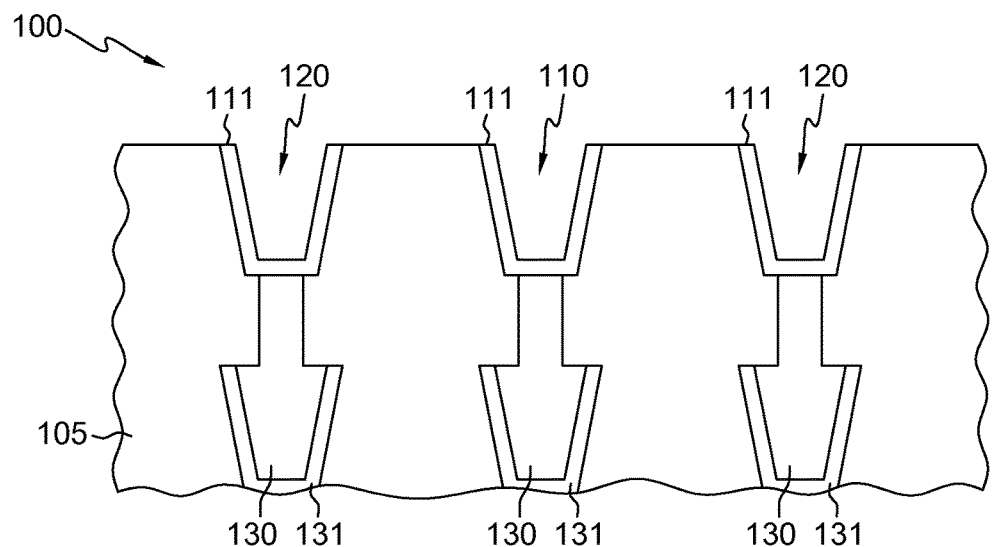
FIGS. 1A-1G depict one embodiment of a process for fabricating a programmable device, in accordance with one or more aspects of the present invention herein.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Many integrated circuits may include fuse structures or programmable devices that allow for customization of the circuit configuration during factory testing or by final users on field, generally through permanently programming the programmable devices. Although several different designs of such programmable devices for permanent programming exist and their methods of use differ depending on their structures, in general one type of programmable devices may be referred to as one time programmable (OTP) devices or electrically programmable fuses (or "e-fuses") in part due to similarities to conventional electrical fuses found in a fuse box. Conventional fuses, for example, normally allow a small current flowing proportional to the monitored current between two nodes (e.g. an outside electric power source and an electrical device such as a light or stove); the fuse allows current flow below a specific level and is designed to break thermally if the current rises above that level (i.e., the fuse is "blown up"). So long as the electrical device draws current below the specific level, the fuse maintains the electrical connection; when the current drawn rises too high, the connection snaps by a violent thermal rupture mechanism, preventing further operation of the device. Similarly, an e-fuse on chip may be a conductive metal structure that provides electrical connection between, for example, two circuit structures (e.g. one metal layer may be connected to an external electric power source and the other metal layer may connect with transistors of the circuit structure). When the metal e-fuse is connected between the external electric power source and a transistor, the e-fuse may be programmed as desired. Programming may be performed after wafer fabrication, for example, after chips have been packaged and are used by users in field. Once the transistor is switched on, a large current may flow through the e-fuse and the "blow-up" or programming of the e-fuse is completed. The blown-up e-fuse may be left as a permanent "open" void, preventing further programming changes. For example, the "blow-up" mechanism may occur through thermal rupture, or electro-migration, in which a large electric current and the heat generated locally drives migration of metal atoms of the e-fuse connection toward one metal layer and away from the other metal layer. Local heating of the metal, generated by the electric current, accelerates the migration of the metal atoms or even trigger the crack or rupture by thermal expansion, eventually breaking the e-fuse connection and leaving the connection "open." Other techniques and designs for e-fuses may also be used.

E-fuse designs as described above have generally been used in prior technology nodes, such as planar CMOS transistor technologies. However, as circuit structures continue to shrink at advanced nodes, new transistor structure designs such as FinFET transistors become necessary, and e-fuse structures of prior technology nodes may not be available with advanced technologies and manufacturing techniques. For example, FinFET transistor structures may frequently be fabricated using replacement metal gate (RMG) processes, which generally requires that middle-of-line (MOL) or back-end-of-line (BEOL) processing be carried out below a certain temperature limit to prevent performance degradation of the FinFET transistors. Silicide e-fuses, however, may subject FinFET transistors to temperatures well above this temperature limit, and thus may be difficult or impossible to integrate with FinFET-based circuit structures. As well, operation of FinFET transistors generally is carried out at low power and low voltage to ensure proper operation and prevent degradation of the transistors. Metal-based e-fuses that operate by electro-migration, however, require high power and high voltage to sever the e-fuse programming, thus also may be highly undesirable for advanced FinFET-based circuit structures operating at low-voltage and low-power.

Thus, generally stated, provided herein is a method for fabricating a programmable device, the fabricating including: forming at least one via opening in a programmable device layer of a circuit structure; providing a catalyzing material over a lower surface of the at least one via opening; forming a plurality of nanowires or nanotubes in the at least one via opening using the catalyzing material as a catalyst for the forming of the plurality of nanowires or nanotubes; and providing a dielectric material with oxygen rich material in the at least one via opening, the dielectric material surrounding, at least in part, the plurality of nanowires or nanotubes. In exemplary embodiments, the method may include programming the programmable device, in which programming may be made permanent by thermal oxidation of the plurality of nanowires or nanotubes and the dielectric material by the heat generated by the current flow through the via, thereby leaving a non-conducting material in the at least one via opening.

Also provided is a structure including a programmable device, the programmable device including: at least one via opening in a programmable device layer of a circuit structure; a plurality of nanowires or nanotubes in the at least one via opening, the plurality of nanowires or nanotubes contacting a lower surface of the at least one via opening; and a dielectric material with oxygen rich in the at least one via opening, the dielectric material surrounding, at least in part, the plurality of nanowires or nanotubes. In exemplary embodiments, the programmable device can be permanently programmed by thermal oxidation of the plurality of nanowires or nanotubes and the dielectric material by the heat generated by the current flowing through the via, thereby leaving a non-conducting material in the at least one via opening.

Reference is made below to the drawings, which are not drawn to scale for ease of understanding, wherein the same reference numbers used throughout different figures designate the same or similar components.

FIGS. 1A-1G depict a structure 100 during fabrication of a programmable device. The programmable device may, in exemplary embodiments, be a one-time programmable (OTP) device. FIG. 1A depicts structure 100 including a programmable device layer 105 of a circuit structure, in which at least one via opening 110 is formed. Programmable device layer 105 may generally include an oxygen-rich dielectric material and/or electrically insulating material, and in exemplary embodiments may include a dielectric material having a low extinction coefficient k and containing abundant oxygen or other oxidizing atoms (e.g., sulfur or fluorine), such as, for instance, silicon nitride (SiN), silicon oxynitride ($SiO_xN_y$), or a low-k silicon oxycarbide (SiOxCy), low-k silicon oxycarbon nitride (SiOxCyNz) material. The at least one via opening 110 may be formed by any appropriate process, such as by a lithographic etching process or other etching process, and may be formed along with a plurality of via openings 120. The at least one via opening 110, as well as the plurality of via openings 120, may have a lower surface and sidewalls coated with a conductive liner material 111, as illustrated in the example of FIG. 1A. Conductive liner material 111 may, in one example, include tantalum and/or tantalum nitride. Conductive liner material 111 may include one layer or may include multiple layers. The at least one via opening 110, as well as the plurality of via openings 120, may be formed over conductive contact material 130 of one or more conductive vias 131, and may be formed to be in electrical contact with the conductive contact material 130. The one or more conductive vias 131 may further connect to additional conductive vias (not depicted) in lower interconnect layers of the circuit structure. Conductive contact material 130 may, for example, include copper or another conductive metal.

Figure 1B:
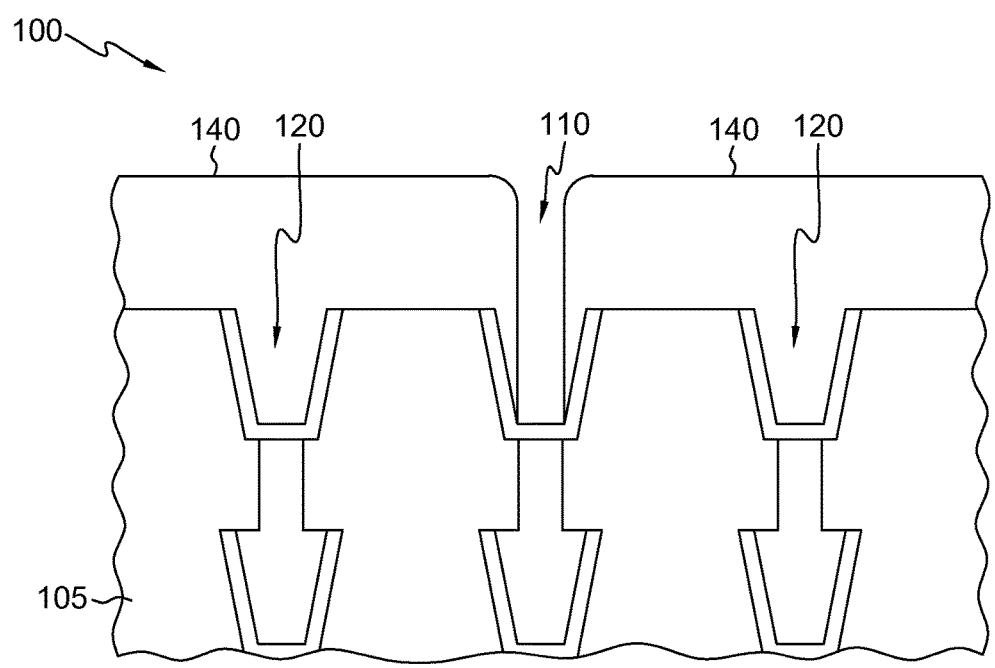

FIG. 1B depicts structure 100 from FIG. 1A, following deposition of a patterned masking material 140 over the plurality of via openings 120. Patterned masking material 140 is patterned to allow at least a portion of the at least one via opening 110 to remain exposed. The plurality of via openings 120 may be covered by patterned masking material 140 to protect the plurality of via openings from provision of a catalyzing material over the at least one via opening 110, as described below and depicted in FIG. 1C, if plurality of via openings 120 are not intended to be made into programmable devices, or alternatively are intended to be made into programmable devices in a separate process. Patterned masking material 140 may, for example, include a photo-resist masking material, and may be patterned, in one example, by lithographic patterning of the photo-resist material.

Figure 1C:
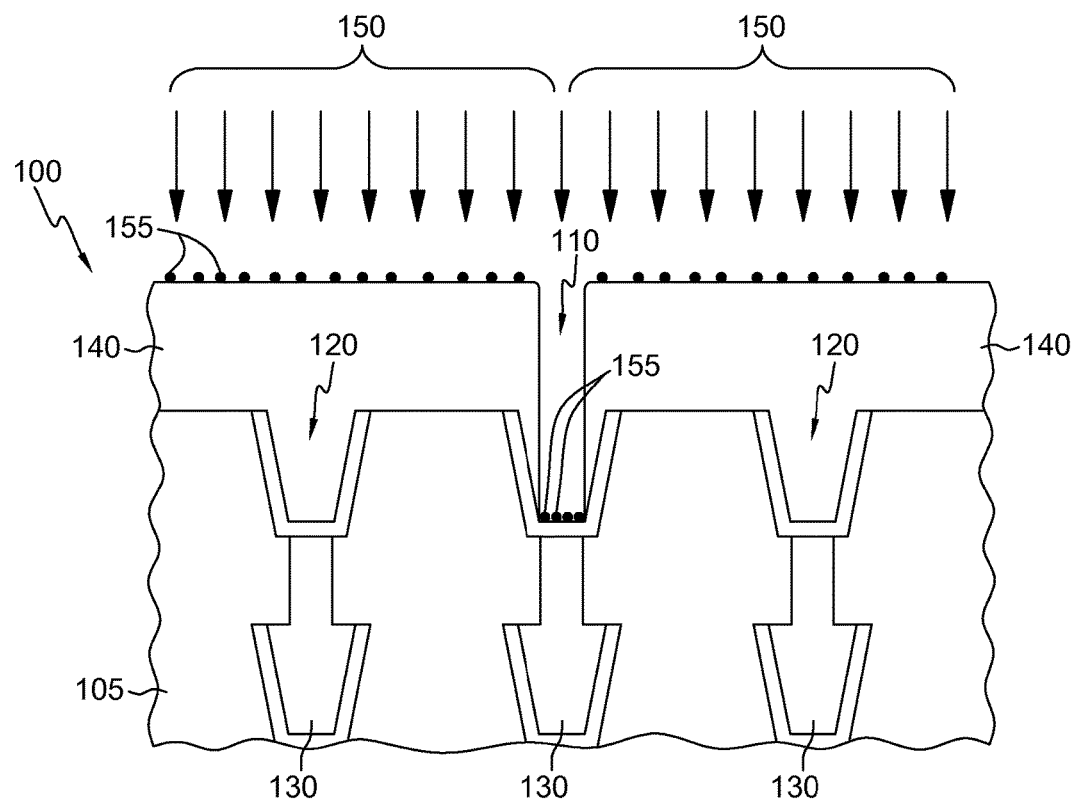

FIG. 1C depicts structure 100 of FIG. 1B following provision 150 of a catalyzing material 155 over a lower surface of at least one via opening 110. Catalyzing material 155 may be deposited over structure 100 by implanting or liquid spin-on solution, as depicted in FIG. 1C, so that patterned masking material 140 blocks or absorbs catalyzing material 155 except over the lower surface of the at least one via opening 110. Patterned masking material 140 may be removed as described below and shown in FIG. 1D.

In one embodiment, providing 150 catalyzing material 155 may include depositing a plurality of conductive particles 155 over the lower surface of at least one via opening 110. The plurality of conductive particles 155 may include one or more of nickel, titanium, erbium, platinum, silver, gold, palladium, indium, tin, antimony, zinc, zirconium, vanadium, hafnium, iron, cobalt, tungsten, tantalum, or gallium. The specific type of conductive particle deposited, as described further below, may have a particle diameter that are significantly smaller than the via and may determine a diameter of the plurality of nanowires or nanotubes formed over the lower surface of the at least one via opening 110. The choice of conductive particles 155 deposited may, in part, be made according to a size of the at least one via opening 110; larger via openings may accommodate larger particle diameters, for example. The choice of conductive particles 155 may also, in part, be made according to a voltage required for programming of the programmable device in later programming steps.

In another embodiment, providing 150 catalyzing material 155 may include depositing a plurality of semiconductor particles 155 embedded in a solvent over the lower surface of the at least one via opening 110. In another example, the semiconductor particles may include silicon, silicon-germanium, and/or a III-V periodic compound, such as gallium-arsenic, to form semiconductor nanowires. In such embodiments, plasma treatment of the exposed lower surface of at least one via opening 110 may be conducted prior to provision 150 of catalyzing material 155 in order make the exposed lower surface electrically active, thus providing a suitable active surface for catalyzing formation of the plurality of nanowires or nanotubes, as further described below. There are negligible catalyzing particles 155 on the sidewall of via if performed by implant and anneal.

Figure 1D:
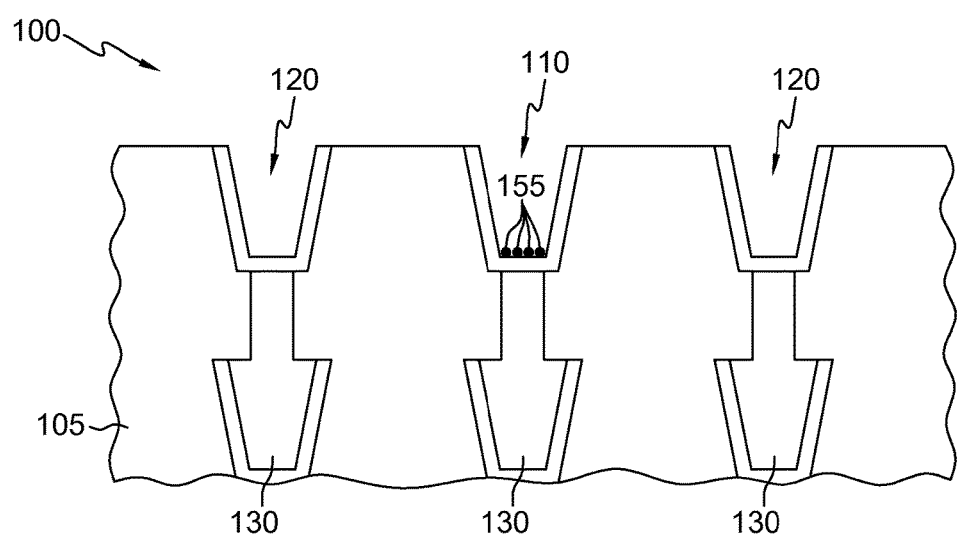

FIG. 1D depicts structure 100 of FIG. 1C following removal of patterned masking material 140. Patterned masking material 140 may be removed prior to forming the plurality of nanowires or nanotubes in the at least one via opening 110. In alternative embodiments the patterned masking material 140 may be left in place during formation of the plurality of nanowires or nanotubes in the at least one via opening 110.

Figure 1E:
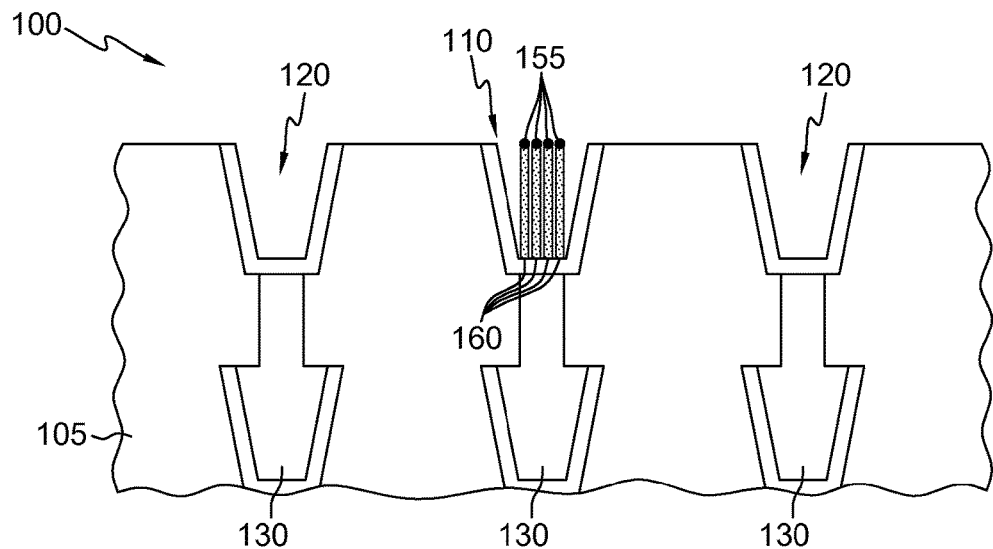

FIG. 1E depicts structure 100 of FIG. 1D following formation of a plurality of nanowires or nanotubes 160. In embodiments in which catalyzing material 155 includes a plurality of conductive particles, formation of the plurality of nanowires or nanotubes 160 may include depositing a semiconductor material over the plurality of conductive particles, such as by a chemical-vapor deposition or vapor-liquid-solid deposition process. (Note: In FIG. 1E, the catalyzing material 155 are typically on top of nanotube or nanowire 160 due to the growth mechanism). The semiconductor material may include, for example, carbon or carbon-based compounds to form carbon nanotubes (CNT) 160 on the plurality of conductive particles 155. In another instance, the semiconductor material may include one or more of silicon, silicon-germanium, and/or a III-V periodic compound such as gallium arsenide, to form semiconductor nanowires 160 on the plurality of conductive particles 155. As noted above, the plurality of conductive particles 155 have a particle diameter, determined by the type of conductive particles selected. The plurality of nanotubes or nanowires 160 may then have a diameter determined, at least in part, by the particle diameter. Conductive particles with a larger diameter, such as platinum and gold, may provide a larger base for the growth of semiconductor particles as the semiconductor material is deposited over the plurality of conductive particles 155, while conductive particles with a smaller diameter, such as titanium and nickel, may provide a smaller base for growth. Generally, an ideal conductive particle 155 with an optimal particle diameter (e.g. <3 nm) may be chosen according to a size of the at least one via opening 110 and the desired diameter of the plurality of nanowires or nanotubes 160, according to a voltage required for programming of the programmable device in later programming steps.

In embodiments in which providing catalyzing material 155 includes depositing a plurality of semiconductor particles 155 embedded in a solvent over the lower surface of the at least one via opening 110 or by implanting metal 155, the formation of the plurality of nanowires or nanotubes 160 may include thermally treating the solvent and semiconductor particles 155 to remove the solvent and catalyze growth of the plurality of nanowires or nanotubes 160 from the semiconductor particles 155. For example, if the plurality of semiconductor particles 155 includes carbon or carbon-based molecules, thermally treating the solvent and semiconductor particles 155 may result in formation of a plurality of carbon nanotubes in the at least one via opening 110. In another example, if the plurality of semiconductor particles 155 includes silicon, silicon-germanium, and/or a III-V period compound, thermal treatment of the solvent and semiconductor particles 155 may result in formation of a plurality of semiconductor nanowires in the at least one via opening 110.

Figure 1F:
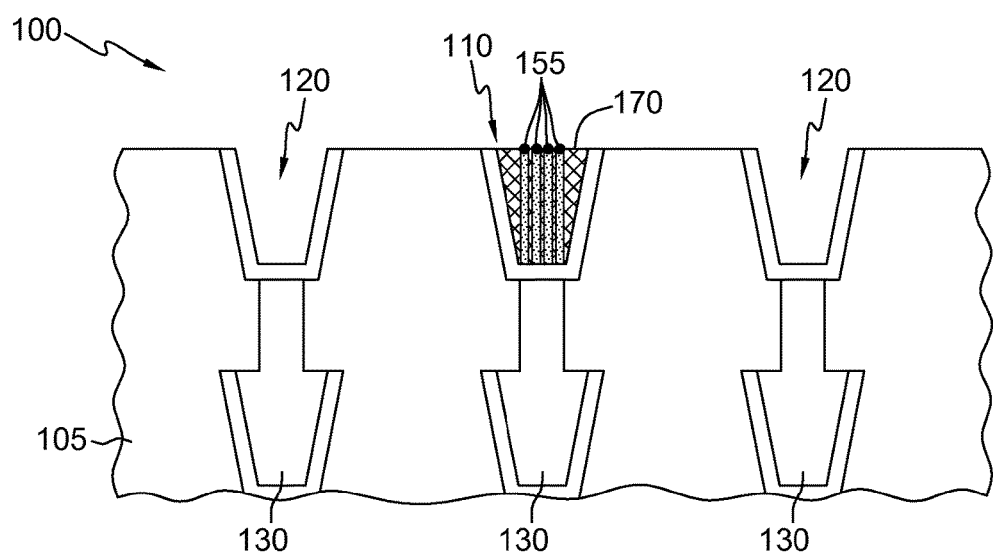

FIG. 1F depicts structure 100 of FIG. 1E following providing a dielectric material 170 in the at least one via opening 110, with the O2-rich dielectric material surrounding, at least in part, the plurality of nanowires or nanotubes 160. Dielectric material 170 may be provided by any appropriate process, such as flowable chemical-vapor deposition (FCVD), and may include providing a patterned masking material, similar to the patterned masking material 140 of FIGS. 1B-1C, over the plurality of via openings 120 to prevent dielectric material 170 from being deposited in or over the plurality of via openings 120. In exemplary embodiments, dielectric material 170 may include an oxygen-rich material such as $O_2$-rich silicon dioxide. Oxygen-rich dielectric materials 170 may facilitate thermal oxidation of the plurality of nanowires or nanotubes 160 in later programming, as described further below, as heat generated by current flowing through the plurality of nanowires or nanotubes 160 may trigger oxidation of the plurality of nanowires or nanotubes 160 by the oxygen-rich dielectric material 170. It may be noted, as illustrated in FIG. 1F, the catalyzing material 155 may be on top of the plurality of nanotubes or nanowires 160 due to the growth mechanism described above.

FIG. 1F depicts, in part, a programmable device prepared for programming or customization. The programmable device depicted in FIG. 1F may, in exemplary embodiments, be a one-time programmable (OTP) device. It may be understood by those with skill in the art that structure 100 may undergo additional processing, such as depositing of a conductive material in the plurality of via openings 120 and/or chemical-mechanical polishing (CMP) processing, to form a completed programmable device and/or completed circuit structure. As may be apparent to those with skill in the art, the exemplary programmable device depicted in FIG. 1F may provide a "single-bit programming architecture." FIGS. 2A and 2B, as described below, illustrate exemplary programmable devices that may provide a "multi-bit programming architecture." It may also be understood that programming and customization of a programmable device may be completed as part of fabricating the programmable device, or programming and customization may be performed in separate processing steps. For example, programming may be performed during testing of the circuit structure. In another example, programming may be completed by users after the circuit structure fabrication is complete and finished chips are sent to users. (Similarly, in FIG. 2A, the catalyzing material 155 are typically on top of nanotube or nanowire 160 due to the growth mechanism).

Programming of the programmable device may include, for example, applying low-power and low-voltage current through the plurality of nanowires or nanotubes 160 of FIG. 1F. The plurality of nanowires or nanotubes 160, being made of a semiconductor material such as carbon or silicon, allow current to flow through the at least one via 110 and through conductive material 130 for programming. Current flowing through the plurality of nanowires or nanotubes 160 may also heat the plurality of nanowires or nanotubes 160, which may in turn heat dielectric material 170 and trigger oxidation of the plurality of nanowires or nanotubes 160, as further described below.

Figure 1G:
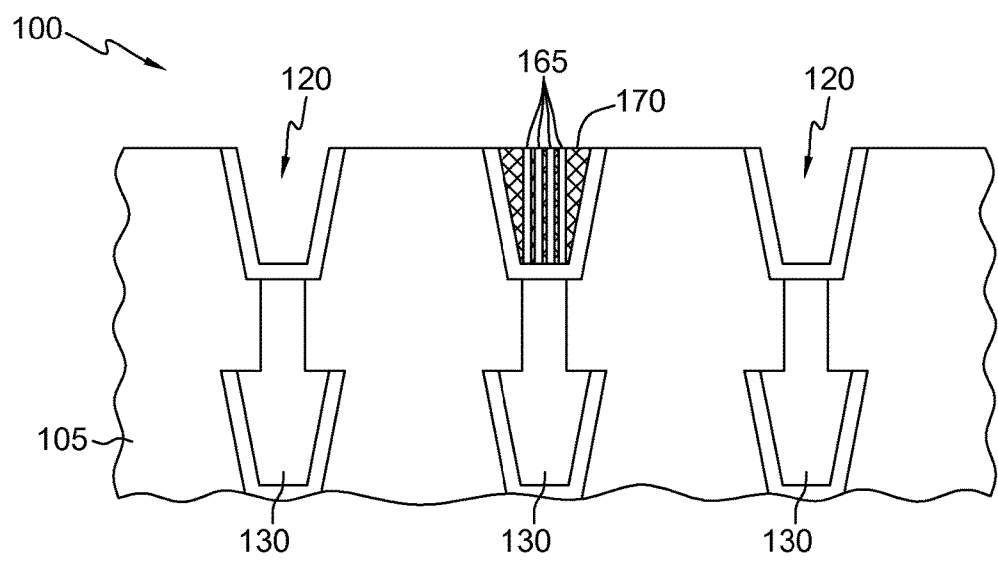

FIG. 1G depicts structure 100 of FIG. 1F of final via structure (with connection not shown for simplicity) following programming of the programmable device. Thermal oxidation of dielectric material 170 and the plurality of nanowires or nanotubes 165 may occur as current is driven through the plurality of nanowires or nanotubes 160 as depicted in FIG. 1F. Current driven through the plurality of nanowires or nanotubes 160 heats the plurality of nanowires or nanotubes 160 and thus may also heat the surrounding O2-rich dielectric material 170, thus triggering thermal oxidation of the plurality of nanowires or nanotubes 160 and resulting in the semiconductor material of the plurality of nanowires or nanotubes 160 oxidizing into a non-conducting material 165. Dielectric material 170 and the oxidized plurality of nanowires or nanotubes 165 together may provide, in at least one via opening 110, a material with high electrical resistance such that electrical connection to conductive material 130 and other interconnect layers of the circuit structure is now "open" so that electrical current effectively may not flow through the at least one via opening 110 after programming is completed. For example, silicon nanowires 160 surrounded by silicon dioxide 170 in FIG. 1F may be oxidized by local heat so that the silicon of the silicon nanowires 160 becomes silicon oxide or silicon dioxide, leaving a non-conducting material with high electrical resistance in the at least one via opening 110.

Because the semiconductor material of the plurality of nanowires or nanotubes may readily heat and thermally oxidize when low current is driven through the plurality of nanowires or nanotubes 160, a programmable device as depicted by the examples of FIGS. 1F and 1G may be compatible with FinFET transistor devices that operate at low power and low voltage. Further, because the semiconductor material of the plurality of nanowires or nanotubes 160 may be thermally oxidized at relatively low temperatures, a programmable device as depicted by the examples of FIGS. 1F and 1G may be programmed with low current (vs the current to blow metal e-fuse by thermal rupture mechanism) and also without degrading the performance of FinFET transistor structures.

Figure 2A:
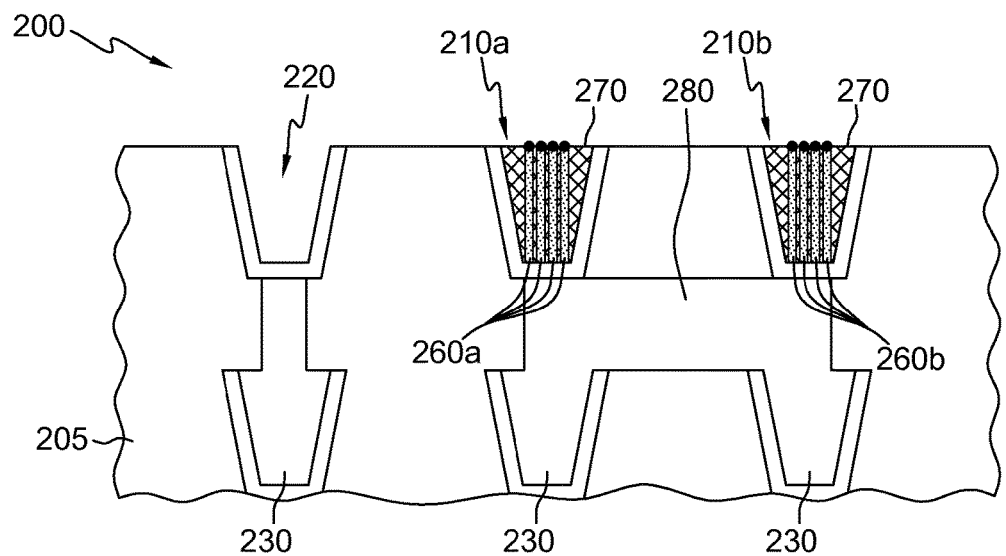
FIGS. 2A-2B depict one alternative embodiment of a process for fabricating a programmable device, in accordance with one or more aspects of the present invention.
Figure 2B:
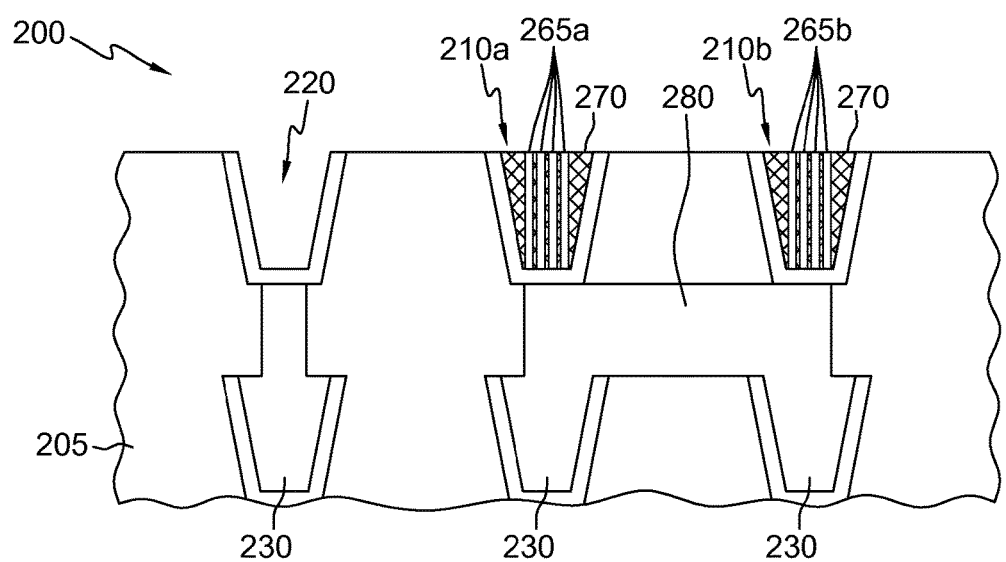

FIGS. 2A-2B depict one alternative embodiment of the processes and structures depicted in FIGS. 1A-1G, in which the at least one via opening 210a is one via opening 210a of a plurality of via openings 210a, 210b, formed in a layer 205 of the programmable device, that are electrically connected. The plurality of via openings 210a, 210b may be electrically connected, for example, by a conductive connection 280 underlying the plurality of via openings 210a, 210b. As depicted in FIG. 2A, a plurality of nanowires or nanotubes 260a may be formed in one via opening 210a and a plurality of nanowires or nanotubes 260b may be formed in another via opening 210b, as described above in FIGS. 1A-1F, and a dielectric material 270 provided in the plurality of via openings 210a, 210b. As illustrated in FIG. 2A, similar to FIG. 1F, the catalyzing material 255 may be on top of the plurality of nanotubes or nanowires 160 due to the growth mechanisms described above. It will be apparent to those with skill in the art that the exemplary embodiment of FIG. 2A may provide a "multi-bit programming architecture" for at least a portion of the programmable device, and that multiple via openings may be electrically connected for the purposes of programming the programmable device. FIG. 2B depicts the structure 200 of FIG. 2A following thermal oxidation of dielectric material 270 and the pluralities of nanowires or nanotubes 265a, 265b to make permanent the programming of the programmable device.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
fabricating a programmable device, the fabricating comprising:
   forming at least one via opening in a programmable device layer of a circuit structure;
   providing a catalyzing material over a lower surface of the at least one via opening;
   forming a plurality of nanowires or nanotubes in the at least one via opening using the catalyzing material as a catalyst for the forming of the plurality of nanowires or nanotubes;
   providing a dielectric material in the at least one via opening, the dielectric material surrounding, at least in part, the plurality of nanowires or nanotubes; and
   wherein providing a catalyzing material comprises depositing a plurality of semiconductor particles embedded in a solvent over the lower surface of the at least one via opening.

2. The method of claim 1, wherein providing a catalyzing material comprises depositing a plurality of conductive particles over the lower surface of the at least one via opening.

3. The method of claim 2, wherein the plurality of conductive particles comprise one or more of nickel, titanium, erbium, platinum, silver, gold, palladium, indium, tin, antimony, zinc, zirconium, vanadium, hafnium, iron, cobalt, tungsten, tantalum, or gallium.

4. The method of claim 2, wherein forming the plurality of nanowires or nanotubes comprises depositing, via a chemical-vapor deposition or vapor-liquid-solid deposition process, a semiconductor material over the plurality of conductive particles, the depositing thereby resulting in growth of the plurality of nanowires or nanotubes.

5. The method of claim 4, wherein the semiconductor material comprises carbon or a carbon-based compound, and the plurality of nanowires or nanotubes comprises a plurality of carbon nanotubes.

6. The method of claim 4, wherein the semiconductor material comprises one or more of silicon, silicon-germanium, or a III-V periodic compound, and the plurality of nanotubes or nanowires comprises a plurality of semiconductor nanowires.

7. The method of claim 4, wherein the plurality of conductive particles have a particle diameter, and wherein the plurality of nanowires or nanotubes have a diameter determined, at least in part, by the particle diameter.

8. The method of claim 1, wherein forming a plurality of nanowires or nanotubes comprises thermally treating the solvent and semiconductor particles to remove the solvent and catalyze growth of the nanowires or nanotubes from the semiconductor particles.

9. The method of claim 8, wherein the semiconductor particles comprise one or more of silicon, silicon-germanium, or a III-V periodic compound, and the plurality of nanotubes or nanowires comprises a plurality of semiconductor nanowires.

10. The method of claim 8, wherein the semiconductor particles comprise carbon or a carbon-based compound, and the plurality of nanowires or nanotubes comprises a plurality of carbon nanotubes.

11. The method of claim 1, wherein the at least one via opening is one via opening of a plurality of via openings in the layer, wherein the plurality of via openings are electrically connected.

12. A method comprising:
fabricating a programmable device, the fabricating comprising:
   forming at least one via opening in a programmable device layer of a circuit structure;
   providing a catalyzing material over a lower surface of the at least one via opening;
   forming a plurality of nanowires or nanotubes in the at least one via opening using the catalyzing material as a catalyst for the forming of the plurality of nanowires or nanotubes;
   providing a dielectric material in the at least one via opening, the dielectric material surrounding, at least in part, the plurality of nanowires or nanotubes;
   wherein providing a catalyzing material comprises depositing a plurality of semiconductor particles embedded in a solvent over the lower surface of the at least one via opening; and
   wherein the dielectric material comprises an oxygen-rich material, the oxygen-rich material facilitating thermal oxidation of the plurality of nanowires or nanotubes in a subsequent processing step.

13. The method of claim 1, further comprising programming the programmable device, wherein the programming may be permanently programmed via thermal oxidation of the plurality of nanowires or nanotubes and the dielectric material to thereby leave a material with high electrical resistance in the at least one via opening.

14. A structure comprising:
a programmable device, the programmable device comprising:
   at least one via opening in a programmable device layer of a circuit structure;
   a plurality of nanowires or nanotubes in the at least one via, the plurality of nanowires or nanotubes contacting a lower surface of the at least one via opening;
   a dielectric material in the at least one via opening, the dielectric material surrounding, at least in part, the plurality of nanowires or nanotubes; and
   wherein the dielectric material comprises an oxygen-rich material, the oxygen-rich material facilitating thermal oxidation of the plurality of nanowires or nanotubes during programming of the programmable device.

15. The structure of claim 14, wherein the plurality of nanowires or nanotubes comprises a plurality of carbon nanotubes.

16. The structure of claim 14, wherein the plurality of nanowires comprises a plurality of nanowires, the plurality of nanowires comprising a semiconductor material.

17. The structure of claim 16, wherein the semiconductor material comprises one or more of silicon, silicon-germanium, or a III-V periodic compound.

18. The structure of claim 14, wherein the programmable device may be permanently programmed via thermal oxidation of the dielectric material and the plurality of nanowires or nanotubes to thereby leave a material with high electrical resistance in the at least one via opening.

* * * * *